United States Patent
Vavelidis et al.

(10) Patent No.: US 8,755,479 B2
(45) Date of Patent: Jun. 17, 2014

(54) MINIMIZATION OF SPURS GENERATED FROM A FREE RUNNING OSCILLATOR

(75) Inventors: Konstantinos Vavelidis, Ilioupolis (GR); Nikolaos Haralabidis, Athens (GR)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/450,134

(22) Filed: Apr. 18, 2012

(65) Prior Publication Data

US 2013/0114771 A1 May 9, 2013

Related U.S. Application Data

(60) Provisional application No. 61/556,094, filed on Nov. 4, 2011.

(30) Foreign Application Priority Data

Apr. 3, 2012 (GR) .............................. 20120100193

(51) Int. Cl.
*H03D 3/24* (2006.01)

(52) U.S. Cl.
USPC .......................... 375/375; 375/295; 708/845

(58) Field of Classification Search
None
See application file for complete search history.

(56) References Cited

U.S. PATENT DOCUMENTS

| 5,267,189 A * | 11/1993 | Wilke ........................... 708/845 |
| 6,928,275 B1 * | 8/2005 | Patrick et al. ................. 455/256 |
| 2009/0072912 A1 * | 3/2009 | Kim et al. ....................... 331/16 |
| 2011/0311012 A1 * | 12/2011 | Chen et al. ..................... 375/376 |

* cited by examiner

*Primary Examiner* — Leon-Viet Nguyen
(74) *Attorney, Agent, or Firm* — Sterne, Kessler, Goldstein & Fox PLLC (57) ABSTRACT

Embodiments of this disclosure include methods in which spurs generated by the drifting of an oscillation frequency of an oscillation signal provided by a free-running oscillator may be minimized and/or eliminated from an output signal of a phase locked loop (PLL). Methods include adjusting the free-running oscillator to prevent the oscillation frequency from drifting so that the spurs are eliminated. Performance data generated when the communications device engages a communications channel that is known not to generate spurs is compared to performance data generated when the communications device engages a desired communications channel. The free-running oscillator is adjusted until the two types of performance data are matched. Other methods include adjusting the dithering module of the PLL to prevent the oscillation frequency from drifting so that the spurs are eliminated.

20 Claims, 5 Drawing Sheets

MINIMIZATION OF SPURS GENERATED FROM A FREE RUNNING OSCILLATOR

CROSS-REFERENCE TO RELATED APPLICATIONS

The present application claims the benefit of U.S. Provisional Patent Appl. No. 61/556,094, filed Nov. 4, 2011, entitled "Long Term Evolution Radio Frequency Integrated Circuit," which is incorporated herein by reference in its entirety.

BACKGROUND

1. Field of Disclosure

The present disclosure relates generally to a phase locked loop (PLL) and specifically to spur suppression in a free running oscillator for the cellular phone.

2. Related Art

Cellular phones have evolved from large devices that were only capable of analog voice communications to comparatively smaller devices that are capable of digital voice communications and digital data communications, such as Short Message Service (SMS) for text messaging, email, packet switching for access to the Internet, gaming, Bluetooth, and Multimedia Messaging Service (MMS) to provide some examples. In addition to these capabilities, the cellular phones of today have additional non-communication related capabilities, such as a camera with video recording, an MPEG-1 Audio Layer 3 (MP3) player, and software applications such as a calendar and a phone book, to provide some examples. Even in light of these capabilities, manufacturers of cellular phones are placing even more capabilities into cellular phones and making these more powerful cellular phones smaller.

At the heart of each cellular phone lies a phase locked-loop (PLL) to generate various electronic signals within the cellular phone. For example, the PLL is responsible for providing various clocking signals within the cellular phone. As another example, the PLL is responsible for providing various electronic signals for transmission and/or reception of data. Some cellular phones also include a free running oscillator, such as a crystal for example, that is external to the PLL. The free running oscillator provides an oscillation signal having an oscillation frequency to the input of the PLL. The oscillation frequency is not fixed, rather, the oscillation frequency may vary or drift over various conditions, such as temperature or time to provide some examples.

Conventionally, the oscillation signal, or an integer or fractional multiple of, may be used as a reference signal by the PLL. The PLL adjusts its output such that its output is related, in either frequency and/or phase, to the oscillation signal. However, as the oscillation signal provided drifts, so does the output of the PLL. This drifting may generate spurs that degrade the performance of the cellular phone.

BRIEF DESCRIPTION OF THE DRAWINGS/FIGURES

Embodiments of the present disclosure are described with reference to the accompanying drawings. In the drawings, like reference numbers indicate identical or functionally similar elements. Additionally, the left most digit(s) of a reference number identifies the drawing in which the reference number first appears.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE PRESENT DISCLOSURE

The following Detailed Description refers to accompanying drawings to illustrate exemplary embodiments consistent with the present disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present disclosure. Therefore, the Detailed Description is not meant to limit the present disclosure. Rather, the scope of the present disclosure is defined only in accordance with the following claims and their equivalents.

Embodiments of the present disclosure may be implemented in hardware, firmware, software, or any combination thereof. Embodiments of the present disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

An Exemplary Communications Device

Figure 1:
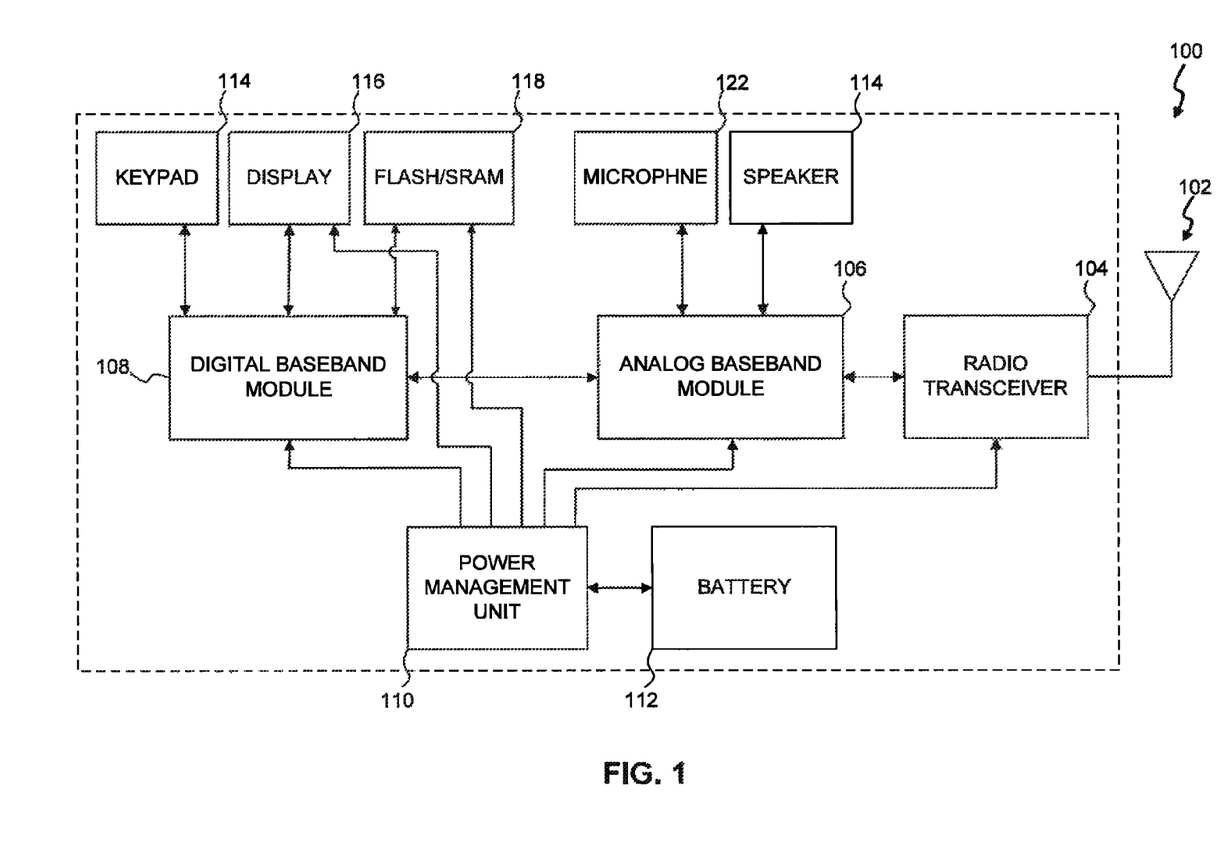
FIG. 1 illustrates a block diagram of a communications device according to an exemplary embodiment of the present disclosure.

FIG. 1 illustrates a block diagram of a communications device according to an exemplary embodiment of the present disclosure. A communications 100 represents a communications device used for voice or data communications from a near-end user to a far-end user over a cellular network. The communications device 100 may communicate with one or more fixed location transceivers, referred to as cell sites, within the cellular network. The cell sites are connected to a cellular telephone exchange that connects to a public telephone network or to another cellular telephone exchange within the cellular network allowing the near-end user to communicate, via the communications device 100, with the far-end user.

The communications device 100 includes an antenna 102, a radio transceiver 104, an analog baseband module 106, a digital baseband module 108, a power management unit (PMU) 110, and a battery 112. The antenna 102 captures a received voice or data communication from the one or more fixed location transceivers and/or provides a transmitted voice or data communication from the radio transceiver 104 to the one or more fixed location transceivers.

The radio transceiver 104 may include one or more amplifiers, such as one or more low noise amplifiers (LNAs) and/or one or more low noise block converters (LNBs) to provide some examples, to amplify the received voice or data communication after it has been captured by the antenna 102 and/or to amplify the transmitted voice or data communication prior to being provided to the one or more fixed location transceivers. The radio transceiver 104 may additionally include one or more filters to filter the received voice or data communication and/or the transmitted voice or data communication, respectively. The radio transceiver 104 may further include one or more mixers to downconvert the received voice or data communication after it has been captured by the antenna 102 and/or to upconvert the transmitted voice or data communication prior to being provided to the one or more fixed location transceivers. The radio transceiver 104 may yet further include a diplexer or switch to separate the received voice or data communication captured from the one or more fixed location transceivers and the transmitted voice or data communication to be provided to the one or more fixed location transceivers.

The analog baseband module 106 performs typical analog signal processing upon the received voice or data communication and/or the transmitted voice or data communication. For example, the analog baseband module 106 may include a channel encoder to encode the transmitted voice or data communication and/or a channel decoder to decode the received voice or data communication according to one or more linear block codes and/or one or more convolutional codes. The analog baseband module 106 may additionally include one or more multiplexers to multiplex a voice communication received from a microphone 122 with a data communication received from the digital baseband processing module 108 and/or one or more demultiplexers to separate the received voice or data communication to provide a voice communication to a speaker 124 and a data communication to the digital baseband processing module 108. The analog baseband module 106 may further include one or more speech encoders to encode the voice communication received from the microphone 122 and/or one or more speech decoders to decode the voice communication provided to the speaker 124. The analog baseband module 106 may yet further include one or more analog to digital converters to convert the data communication to be provided to the digital baseband processing module 108 to a digital representation and/or one or more digital to analog converters to convert the data communication from the digital baseband processing module 108 to an analog representation.

The digital baseband processing module 108 performs typical digital signal processing upon the data communication provided by the analog baseband module 106 and/or the data communication to be provided to the analog baseband module 106. The digital baseband processing module 108 may include one or more processors to load one or more software applications from the flash/SRAM 118. The one or more software applications may operate upon the data communication provided by the analog baseband module 106 to provide a graphical output to a display 116. A keypad 114 may provide a numerical input, such as a telephone number of the far-end user, a text message for a Short Message Service (SMS) application, an electronic mail message destined for the near-end user, or any other suitable application to be performed by the near-end user to provide some examples, to the digital baseband processing module 108. The one or more software applications may operate on this numerical input to provide the data communication for the analog baseband module 106. The one or more software applications, such as electronic games to provide an example, may operate upon the numerical input from the keypad 114 to provide the graphical output to the display 116 and/or voice data for the analog baseband module 106 for the speaker 124. The digital baseband processing module 108 may further store the numerical input from the keypad 114, the graphical output to the display 116, and/or the data communication provided by the analog baseband module 106 into the flash/SRAM 118.

The PMU 110 is responsible for monitoring power connections and battery charges, charging batteries when necessary, and controlling power to other integrated circuits, as well other power functions of the cellular phone. For example, the PMU 110 converts a first voltage received from a battery 112, and/or any other suitable source, to one or more second voltages to be used by the cellular phone 100. The PMU may additionally include one or more battery chargers to charge the battery 112 from an external alternating current (AC) and/or direct current (DC) source. The PMU may further communicate a status of the battery 112 to the digital baseband processing module 108.

The battery 112 may include one or more nickel-cadmium (NiCd), one or more nickel metal hydride (NiMH), and/or one or more lithium-ion (Li-ion) cells. However, this example is not limiting, those skilled in the relevant art(s) may implement the battery 112 using other battery chemistries without departing from the scope and spirit of the present disclosure. The one or more cells of the battery 112 convert chemical energy into electrical energy via an electrochemical reaction.

The cellular phone 100 may include one or more phase lock loops (PLLs) to generate various signals for the radio transceiver 104, the analog baseband module 106, the digital baseband module 108, and/or the PMU 110. For example, the one or more PLLs may be used to generate an analog signal, a digital signal, a data signal, and/or a clocking signal for the radio transceiver 104, the analog baseband module 106, the digital baseband module 108, and/or the PMU 110. However, these examples are not limiting, those skilled in the relevant art(s) will recognize that other electronic signals may be generated by the one or more PLLs without departing from the spirit and scope of the present disclosure.

One or more components of the cellular phone 100, such as, but not limited to, the radio transceiver 104, the analog baseband module 106, the digital baseband module 108, and/or the PMU 110 to provide some examples, may be implemented on a semiconductor chip or die. For example, the digital baseband module 108 and the PMU 110 may be implemented on a semiconductor chip or die. Alternatively, the one or more components of the cellular phone 100 may be each implemented on a single chip or die. For example, the radio transceiver 104, the analog baseband module 106, the digital baseband module 108, and/or the PMU 110 may each be implemented on a single chip or die.

A Conventional Phase Locked Loop (PLL)

Figure 2:
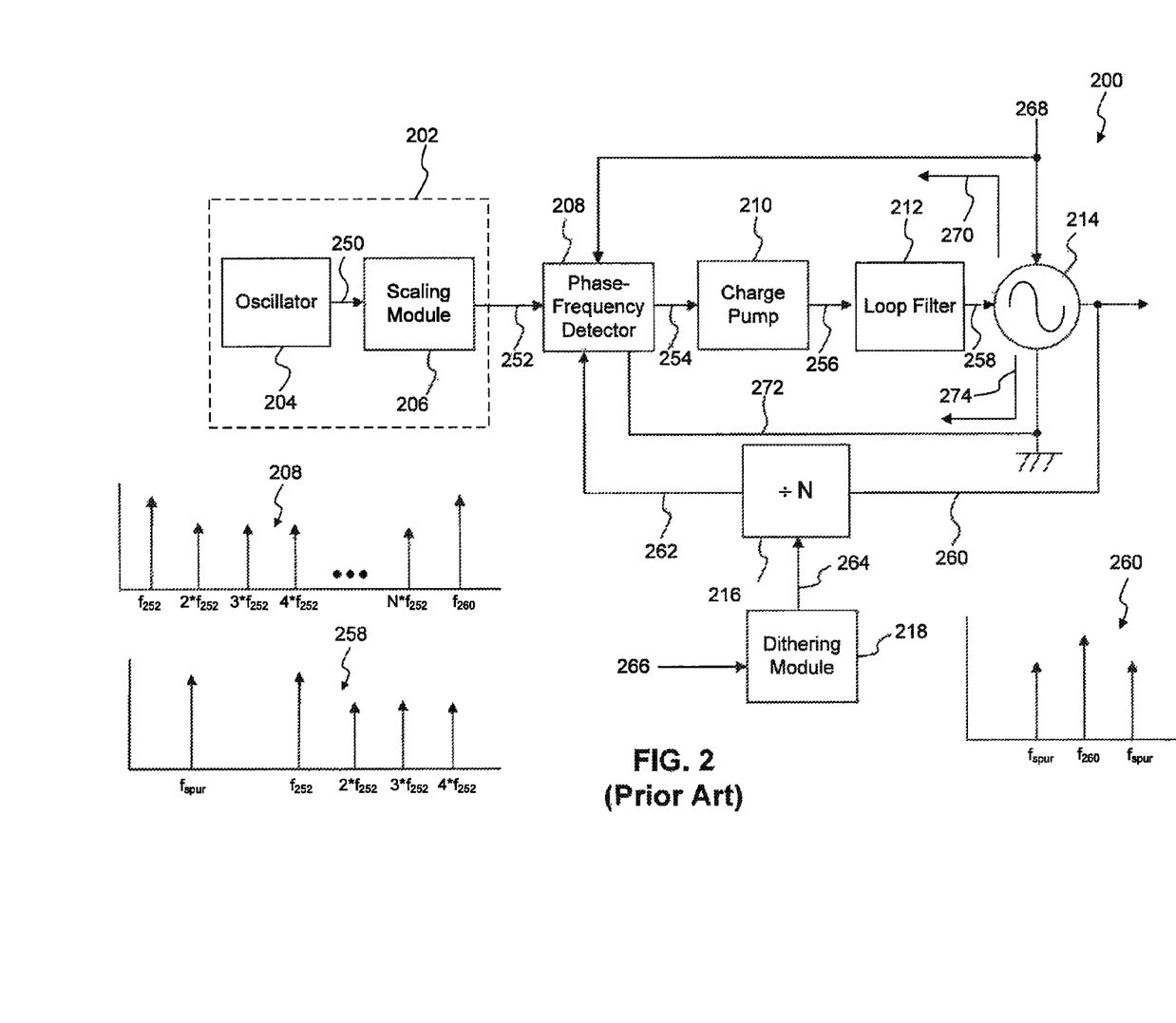
FIG. 2 is a block diagram of a conventional reference PLL that is used in a conventional communications device.

FIG. 2 is a block diagram of a conventional reference PLL that is used in a conventional communications device. A conventional reference PLL 200 represents a closed-loop feedback control system that generates a target signal 260 in relation to a frequency and a phase of reference signal 252. In other words, the conventional reference PLL 200 performs frequency multiplication and/or division, via a negative feedback mechanism, to generate the target signal 260 in terms of the reference signal 252. The conventional reference PLL 200 may be implemented using a conventional reference oscillator, conventional phase/frequency detector (PFD) 208, a charge pump 210, a loop filter 212, a voltage controlled oscillator (VCO) 214, an optional integer frequency divider 216, and an optional dithering module 218.

The conventional reference oscillator 202 provides the reference signal 252 to the conventional PFD 208. The reference signal 252 is related to a desired operating frequency of the conventional reference PLL 200. For example, a frequency of the reference signal 252 may be approximately equal or an integer or fractional multiple of the desired operating frequency of the conventional reference PLL 200. The conventional reference oscillator 202 includes a conventional oscillator 204 and a conventional optional scaling module 206. The conventional oscillator 204 provides a reference signal 250. The conventional optional scaling module 206 multiplies and/or divides the reference signal 250 to generate the reference signal 252.

The conventional oscillator 204 can be characterized as being a free-running external oscillator. The conventional oscillator 204 provides the reference signal 250 that is characterized as having a frequency that is not fixed. Rather, the frequency of the reference signal 250 may vary or drift due to conditions within the conventional reference PLL 200 or elsewhere within the conventional reference PLL 200. For example, the frequency and/or phase of the reference signal 250 may drift when the temperature increases and/or decreases over time in the conventional reference PLL 200.

The conventional PFD 208 converts a difference between the frequency and/or the phase of the reference signal 252 and a phase and/or a frequency of a divided feedback signal 262 into an error signal 254. Specifically, the conventional PFD 208 produces the error signal 254 by comparing the frequency and/or the phase of the divided feedback signal 262 and the frequency and/or the phase of the reference signal 252 to detect for deviations between the reference signal 252 and the divided feedback signal 262. When the phase and the frequency of the error signal 254 and the phase and the frequency of the divided feedback signal 262 are substantially equivalent, the conventional reference PLL 200 is in the locked condition. In the locked condition, the error signal 254 is proportional to the phase difference between the reference signal 252 and the divided feedback signal 262.

The charge pump 210 converts the error signal 254 to a voltage/current domain representation, denoted as a charge pump output 256, to control a frequency of the VCO 214. When the conventional reference PLL 200 is in the unlocked condition, the charge pump 210 increases or decreases the charge pump output 256 based on the error signal 254. When the conventional reference PLL 200 is in the locked condition the error signal 254 is minimized and the charge pump 210 maintains the charge pump output 256 at a substantially fixed value.

The loop filter 212 may be used to remove undesirable noise from the charge pump output 256 to generate a tuning signal 258. The loop filter 212 may be implemented as a low pass filter to suppress high frequency components in the charge pump output 256 to allow a direct current (DC), or near DC, component of the charge pump output 256 to control the VCO 214. The loop filter 212 also maintains stability of the conventional reference PLL 200.

The VCO 214 is a voltage to frequency converter. Specifically, the VCO 214 produces the target signal 260 based upon the tuning signal 258. The tuning signal 258 is used to further adjust the target signal 260 until it is approximately equal to an integer or fractional multiple of the reference signal 252.

The optional integer frequency divider 216 is located in a feedback path of the conventional reference PLL 200. The optional integer frequency divider 216 divides the target signal 260 by an integer N to provide the divided feedback signal 262.

The optional dithering module 218 allows the conventional reference PLL 200 to dither the divide value over time between two or more integer values to obtain an effective time averaged fractional division factor. More specifically, the optional dithering module 218 selects between the two or more integer values for each iteration of the conventional reference PLL 200 in response to a division code 264, so that on average, a fractional division factor can be represented. The optional dithering module 212 generates the division code 260 in response to the divide ratio control signal 266.

Typically, imperfections within the conventional reference PLL 200 may cause unwanted electromagnetic energy, commonly referred to as frequency spurs or simply spurs, to be coupled onto the target signal 260. Generally, a frequency of the one or more spurs may be characterized as:

$$\sum_{k=1}^{i*j} f_{spur}[k] = \sum_{M=1}^{i} \sum_{N=1}^{j} [f_{LO} \pm M * (f_{VCO} - N * f_{ref})], \quad (1)$$

where $f_{spur}$ represents a frequency of a $k^{th}$ spur from among the one or more spurs, $f_{LO}$ represents a frequency of a desired output of the conventional reference PLL 200, $f_{VCO}$ represents a frequency of the target signal 260, and $f_{252}$ represents a frequency of the reference signal 252. Typically, the reference signal 252 can be characterized as including a fundamental frequency and one or more integer multiples, referred to as harmonics, of the fundamental frequency. The integer N ranges from 1 to j which corresponds to integer multiples of the fundamental frequency that are present within the reference signal 252, where N=1 corresponds to the fundamental frequency, N=2 corresponds to a second harmonic of the fundamental frequency, etc. Typically, a value for the integer N that minimizes $(f_{VCO}-N*f_{ref})$ is the most problematic within the conventional reference PLL 200. The one or more spurs are typically evenly spaced, in frequency, from the frequency of the desired output of the conventional reference PLL 200. The integer M ranges from 1 to i which corresponds an order of the spurs that are present within the target signal 260, where M=1 corresponds to a first order spur, M=2 corresponds to a second order spur, etc.

Ideally, a frequency of the target signal 260 is characterized as having the fundamental frequency $f_0$ that is sufficiently proportional to the frequency of the reference signal 252. However, in practice, the conventional oscillator 204 may drift from its theoretical value based upon a drift parameter $\epsilon$. This drifting may cause the frequency of the target signal 260 to be:

$$f_{260} = (N \pm \epsilon) * f_{252}, \quad (2)$$

where $f_{260}$ represents the frequency of the target signal 260, $f_{252}$ represents a frequency of the reference signal 252, N represents an integer multiple of the fundamental frequency of the reference signal 252, and $\epsilon$ represents the drift parameter of the conventional oscillator 204.

Typically, a control voltage is coupled onto the tuning signal 258 to, in essence, stabilize the target signal 260 to a fixed frequency. The target signal 260 is divided by the optional integer frequency divider 216 to provide the divided feedback signal 262. Similarly, the divided feedback signal 262 can be characterized as having an essentially fixed frequency. Ideally, the frequency of the reference signal 252 is approximately equal to the frequency of the divided feedback signal 262. However, the drifting of the conventional oscillator 204 may cause an actual frequency of reference signal 252 to differ from its theoretical or expected value.

In this non-ideal situation, the output of the conventional PFD 208 includes one or more spurious components at various multiples of a difference between the actual frequency of the reference signal 252 and the divided feedback signal 262. For example as shown regarding the conventional PFD 208, $f_{252}$ represents the frequency of the reference signal 252. Each of $2*f_{252}$, $3*f_{252}$, $4*f_{252}$, and $N*f_{252}$ represent each harmonic frequency of the reference signal 252. Ideally, the frequency $N*f_{252}$ of the Nth harmonic of the reference signal 252 is approximately equal to the frequency $f_{260}$ of the target signal 260. However, the drifting of the conventional oscillator 204 causes the frequency $N*f_{252}$ to differ from the frequency $f_{260}$ of the target signal 260.

The conventional PFD 208 mixes the Nth harmonic of the reference frequency 252 with the target signal 260 to generate spurious components with a frequency $f_{spur}$. The frequency $f_{spur}$ of the spurious components may not be within the bandwidth of loop filter 212. For example as shown regarding the tuning signal 258, the spurious components that include the frequency $f_{spur}$ are not within the bandwidth of loop filter 212 and are coupled onto the tuning signal 258.

The tuning signal 258 is then modulated by the VCO 214 onto the target signal 260 thereby degrading performance of the communications device 100. For example as shown regarding the target signal 260, the spurious components couple onto the target signal 260 such that the spurious components operate at a frequency $f_{spur}$ that is offset from frequency $f_{260}$ of the target signal 260.

Additionally, undesirable coupling of various signals within the conventional reference PLL 200 may couple, either directly or indirectly, onto other signals within the conventional reference PLL 200 causing the one or more spurs. For example, the conventional VCO 214 is typically coupled to a common power signal 268 and a common ground connection 272. During operation, the target signal 260 may couple onto the common power signal 268, although attenuated, to provide undesired target signal 270 and/or onto the common ground connection 272, although attenuated, to provide an undesired target signal 274.

As shown in FIG. 2, various modules of the conventional PLL 200, such as the conventional PFD 208, are also coupled to the common power signal 268 and the common ground connection 272. As a result, the undesired target signal 270 and the undesired target signal 274 may be coupled onto various electronic signals, via the common power signal 268 and the common ground connection 272, within these modules causing the one or more spurs. For example, the conventional PFD 208 may represent an active device that is coupled to the common power signal 268 and the common ground connection 272. In this situation, the conventional PFD 208 can undesirably mix the reference signal 252 with the undesired target signal 270 and the undesired target signal 274 causing the one or more spurs.

A First Exemplary Reference PLL

Figure 3:
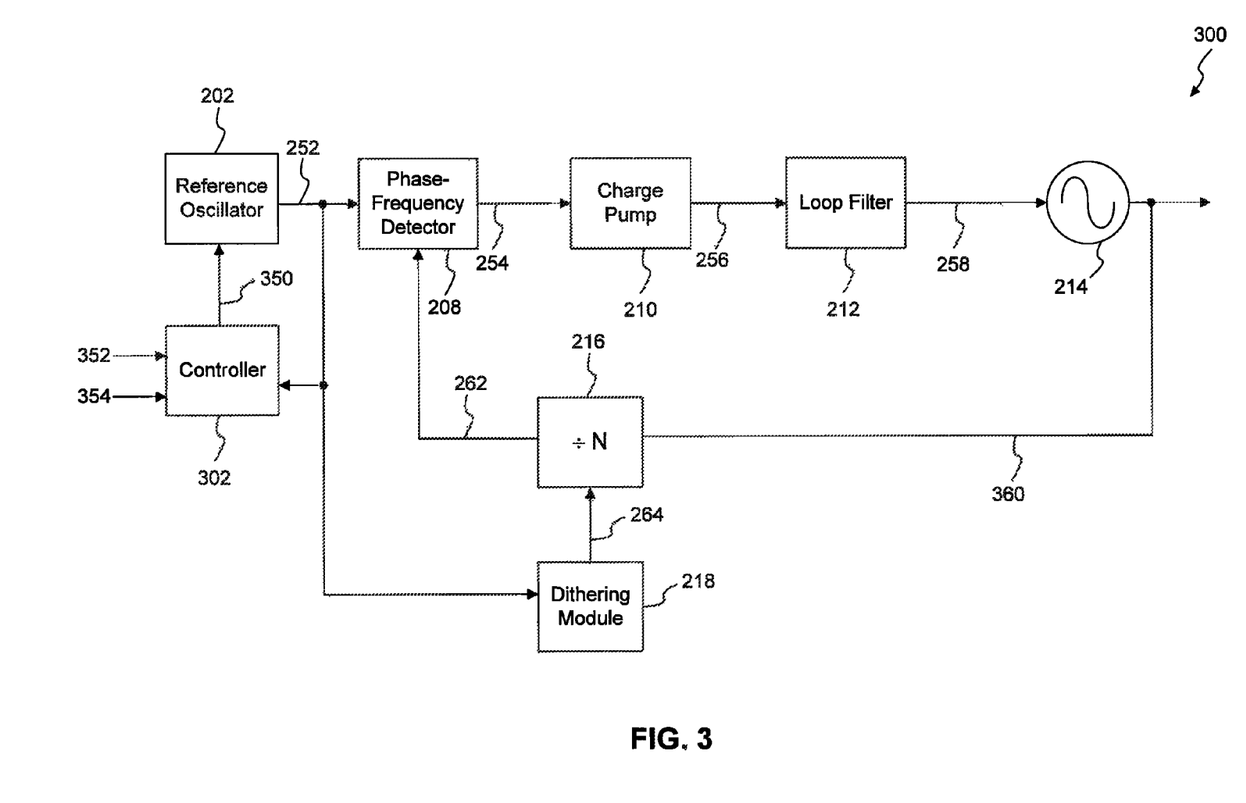
FIG. 3 is a block diagram of a reference PLL that may be used in the communications device according to an exemplary embodiment of the present disclosure.

FIG. 3 is a block diagram of a first reference PLL that may be used in the communications device according to an exemplary embodiment of the present disclosure. A reference PLL 300 includes a controller module 302 to adjust the frequency and/or phase of the reference signal 252 provided by the reference oscillator 202 so that the frequency and/or phase of the reference signal 252 is proportional to a frequency and/or phase of a target signal 360. Spurs that are generated when the reference signal 252 drifts may be eliminated by adjusting the reference signal 252 to, compensate for this drifting. The reference PLL 300 may be implemented using the reference oscillator 202, the phase/frequency detector (PFD) 208, the charge pump 210, the loop filter 212, the voltage controlled oscillator (VCO) 214, the integer frequency divider 216, the dithering module 218, and a controller module 302. The reference PLL 300 shares many similar features with the conventional reference PLL 200; therefore, only the differences between the conventional reference PLL 200 and the reference PLL 300 are to be discussed in further detail.

Several communication systems including the reference PLL 300 may receive the reference signal 252 from the reference oscillator 202 as an input signal. As the reference signal 252 drifts away from the center frequency of the communications channel, spurs may be generated on each output signal of each communication system. The frequency and/or phase of the reference signal 252 may be adjusted abruptly to be sufficiently proportional to the frequency and/or phase of each output signal of each communication system. However, communication systems that operate in a slower fashion than the communications device 100, such as a global positioning system (GPS) to provide an example, may be unable to track the reference signal 252 when it is adjusted abruptly. The reference PLL 300 may adjust the frequency and/or phase of the reference signal 252 in a gradual fashion so that other communication systems may be able to track the reference signal 252.

During an initial power up cycle of the communications device 100, the communications device 100 may engage an initial communications channel where there is no possibility of spur generation on the target signal 360. The communications device 100 may have a priori knowledge that the initial communications channel may not generate spurs on the target signal 360 once the communications device 100 engages the initial communications channel. Once the communications device 100 engages the initial communications channel, the controller module 302 measures initial performance data 352. The initial performance data 352 may include digital signal processing (DSP) data generated when the communications device 100 engages the initial communications channel. The initial performance data 352 may include a bit rate, a signal to noise ratio, and/or any other suitable DSP data that will be apparent to those skilled in the relevant art(s) without departing from the spirit and scope of the present disclosure.

Once the controller module 302 measures the initial performance data 352 for the initial communications channel, the communications device 100 may engage a desired communications channel. The desired communications channel may be the communications channel in which the communications device 100 desires to operate in. The controller module 302 may measure actual performance data 354. The actual performance data 354 may include DSP data generated when the communications device 100 engages the desired communications channel. The actual performance data 354 may include a bit rate, a signal to noise ratio, and/or any other suitable DSP data that will be apparent to those skilled in the relevant art(s) without departing from the spirit and scope of the present disclosure.

The controller module 302 may compare the initial performance data 352 to the actual performance data 354. Any difference between the initial performance data 352 to the actual performance data 354 may indicate that the frequency and/or phase of the reference signal 252 may not be sufficiently proportional to the frequency and/or phase of the target signal 360 resulting in spur generation on the target signal 360.

For example, the controller module 302 compares the bit rate provided by the initial performance data 352 to the bit rate provided by the actual performance data 354. The bit rate provided by the initial performance data 352 represents the bit rate of the communications device 100 when engaged in a communications channel that does not result in spur generation on the target signal 360. The controller module 302 determines that the bit rate provided by the actual performance data 354 is different from the bit rate provided by initial performance data 352. The difference in bit rate signifies that the frequency and/or phase of the reference signal 252 is different from the frequency and/or phase of the target signal 360 resulting in spur generation on the target signal 360.

If the controller module 302 determines that the initial performance data 352 differs from the actual performance data 354, the frequency and/or the phase of the reference signal 252 may have drifted away from the frequency and/or phase of the target signal 360. As a result, the spurs may have been generated on the target signal 360. The controller module 302 may adjust the frequency and/or phase of the reference signal 252 by adjusting a control signal 350. In an example, the control signal 350 may include an analog signal where examples of the analog signal may include a continuous variable analog voltage, a continuous variable analog current, an analog signal with discrete levels provided by a digital-to-analog converter (DAC) and/or any other analog signal that will be apparent to those skilled in the relevant art(s) without departing from the spirit and scope of the present disclosure. In another example, the control signal 350 may include a digital signal. In a further example, the control signal 350 may include a combination of analog and digital signals where both the analog signal and the digital signal may control the frequency and/or phase of the reference signal 252 provided by the reference oscillator 202. The controller module 302 may shift the control signal 350 such that the frequency and/or phase of the reference signal 252 may be sufficiently proportional to the frequency and/or phase of the target signal 360 so that the spurs may be eliminated from the target signal 360.

The controller module 302 may provide the control signal 350 that causes the reference oscillator 202 to adjust the frequency and/or phase of the reference signal 252. Typically, the controller module 302 adjusts the control signal 350 until the target signal 360 is sufficiently related to the reference signal 252 during the full calibration. For example, the controller module 302 may cycle through different combinations of the control signal 350 using a searching algorithm, such as a binary search tree algorithm, a recursion algorithm, a Stern-Brocot algorithm and/or any other suitable search that will be apparent to those skilled in the relevant art(s) without departing from the spirit and scope of the present disclosure until the target signal 360 is sufficiently related to the reference signal 252.

In an embodiment, the controller module 302 provides a first value for the control signal 350 to cause the reference oscillator 202 to provide the reference signal 252 at a first frequency. The controller module 302 monitors the actual performance data 354 once the reference signal 252 has reached the first frequency. The controller module 302 compares the actual performance data 354 to the initial performance data 352 to determine whether the reference PLL 300 is in the locked condition. For example, the controller module 302 compares a magnitude of the difference between the actual performance data 354 and the initial performance data 352 to a locking threshold. When the magnitude of the actual performance data 354 and the initial performance data 352 is less than or equal to the locking threshold, the target signal 360 is sufficiently related to the reference signal 252. In this situation, the reference PLL 300 enters into the locked condition to track the reference signal 252 such that the spurs are eliminated from the target signal 360.

However, when the magnitude of the difference is greater than the locking threshold, the target signal 360 is not sufficiently related to the reference signal 252. In this situation, the reference PLL 300 is in the unlocked condition. The controller module 302 then provides a second value for the control signal 350 to cause the reference oscillator 202 to provide the reference signal 252 at a second frequency. The controller module 302 determines whether the second frequency causes the reference PLL 300 to enter into the locked condition. If not, the controller module 302 continues to adjust the control signal 350 until the reference PLL 300 enters into the locked condition such that the spurs are eliminated from the target signal 360. However, this example is not limiting, those skilled in the relevant art(s) will recognize that other methods may be used in tuning the reference PLL 300 so that the reference PLL 300 enters into the locked condition.

The controller module 302 provides a predetermined number of different values for the control signal 350 to cause the reference oscillator 202 to provide the reference signal 252 at different frequencies. In an exemplary embodiment, the predetermined number of different values represents a single combination of the searching algorithm. However, this example is not limiting, those skilled in the relevant art(s) will recognize that the predetermined number of different values may represent any suitable number of different combinations of the searching algorithm without departing from the spirit and scope of the present disclosure.

For example, the controller module 302 provides a first value to cause the reference oscillator 202 to provide the reference signal 252 at a first frequency. The controller module 302 measures the bit rate provided by the actual performance data 354 based on the change in frequency of the reference signal 252. The controller module 302 compares the bit rate provided by the actual performance data 354 to the bit rate provided by the initial performance data 352. The controller module 302 determines that the difference in the bit rate provided by the actual performance data 354 to the bit rated provided by the initial performance data 352 has increased rather than decreased.

As a result, the controller module 302 provides a second value to cause the reference oscillator to provide the reference signal 252 at a second frequency. The controller module 302 measures the bit rate provided by the actual performance data 354 based on the change in frequency of the reference signal 252. The controller module 302 compares the bit rate provided by the actual performance data 354 to the bit rate provided by the initial performance data 352. The controller module 302 determines that the difference in the bit rate provided by the actual performance data 354 to the bit rate provided by the initial performance data 352 is less than the locking threshold. The controller module 302 no longer adjusts the control signal 350 because the reference PLL 300 has entered the locked condition such that spurs are eliminated from the target signal 360.

A Second Exemplary Reference PLL

Figure 4:
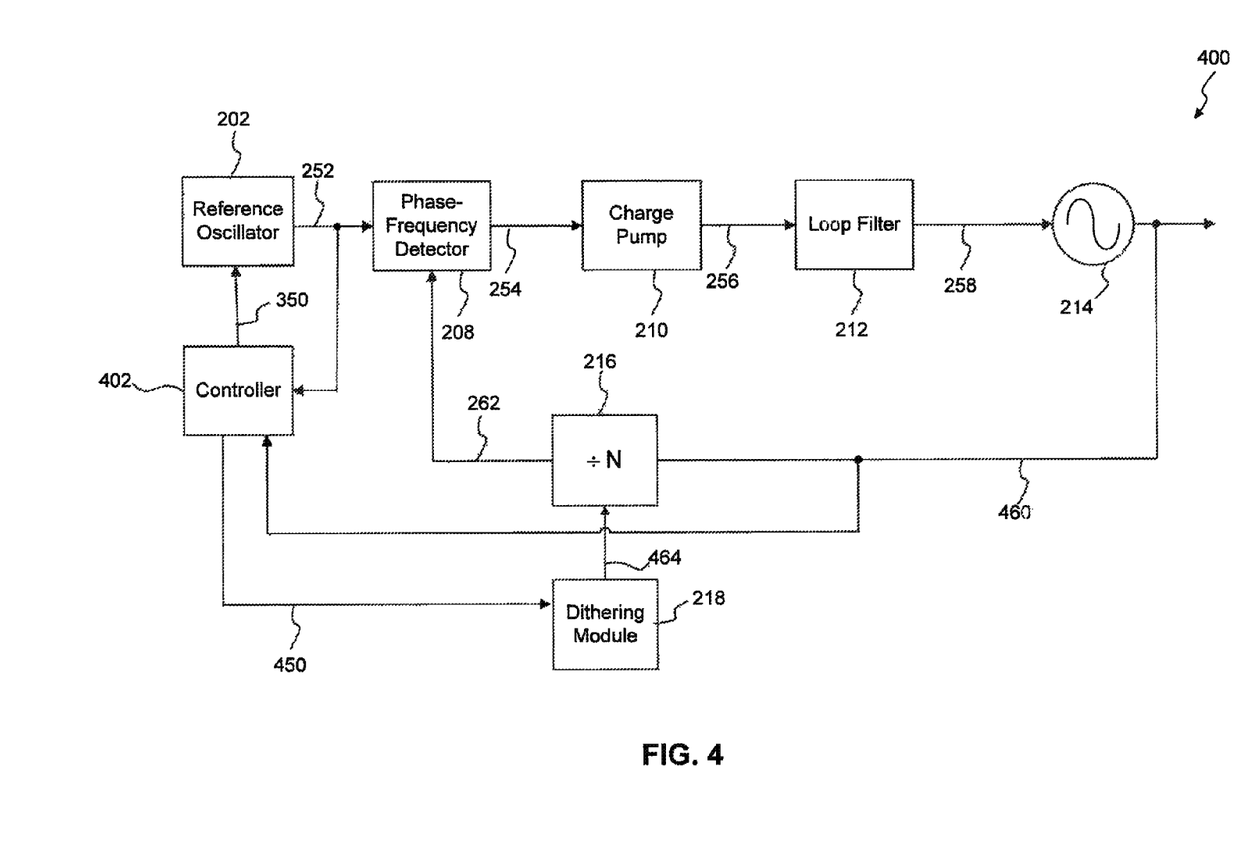
FIG. 4 is a block diagram of a reference PLL that may be used in the communications device according to an exemplary embodiment of the present disclosure.

FIG. 4 is a block diagram of a second reference PLL that may be used in the communications device according to an exemplary embodiment of the present disclosure. A reference PLL 400 includes a controller module 402 that adjusts the division code 464 provided by the dithering module 218 so that the frequency and/or phase of the reference signal 252 is proportional to a frequency and/or phase of a target signal 460. Spurs that are generated when the frequency and/or phase of the reference signal 252 drifts away from the frequency and/or phase of the target signal 460 may be eliminated when the division code 464 is adjusted to compensate for the difference between the frequency and/or phase of the reference signal 252 with the frequency and/or phase of the target signal 460. In eliminating the spurs, the degradation of the overall performance of the communications device 100 may be minimized. The reference PLL 400 may be implemented using the reference oscillator 202, the phase/frequency detector (PFD) 208, the charge pump 210, the loop filter 212, the voltage controlled oscillator (VCO) 214, the integer frequency divider 216, the dithering module 218, and a controller module 402. The reference PLL 400 shares many similar features with the conventional reference PLL 200; therefore, only the differences between the conventional reference PLL 200 and the reference PLL 400 are to be discussed in further detail.

The controller module 402 may adjust a control signal 450 such that the dithering module 218 adjusts the division code 464 in order to compensate for the change in frequency and/or phase of the reference signal 252. Based on the division code 464, the integer frequency divider 216 may adjust the divided feedback signal 262 so that the frequency and/or phase of the reference signal 252 may be sufficiently proportional to the frequency and/or phase of the target signal 460. As a result, the spurs generated on the target signal 460 may be eliminated.

For example, the controller module 402 determines the difference in frequency and/or phase between the reference signal 252 and the target signal 460. Based on the difference, the controller module 402 determines how the dithering module 218 may dither the divide value provided by the integer frequency divider 216 over time between two or more integer values to obtain an effective time averaged fractional division factor. The controller module 402 may adjust the control signal 450 such that the effective time averaged fractional division factor provided by the integer frequency divider 216 may adjust the frequency and/or phase of the reference signal 252 to be sufficiently proportional to the frequency and/or phase of the target signal 460. The controller module 402 may adjust the control signal 450 in a similar fashion as discussed above regarding the controller module 302 adjusting the control signal 350. In doing so, the spurs may be eliminated from the target signal 460.

A Fourth Exemplary Reference PLL

Although not illustrated, those skilled in the relevant art(s) will recognize that one or more of the methods and/or apparatuses as described in FIG. 3 and FIG. 4 may be combined to form other reference PLLs without departing from the spirit and scope of the present disclosure.

An Exemplary Operational Control Flow of the Communication Device

Figure 5:
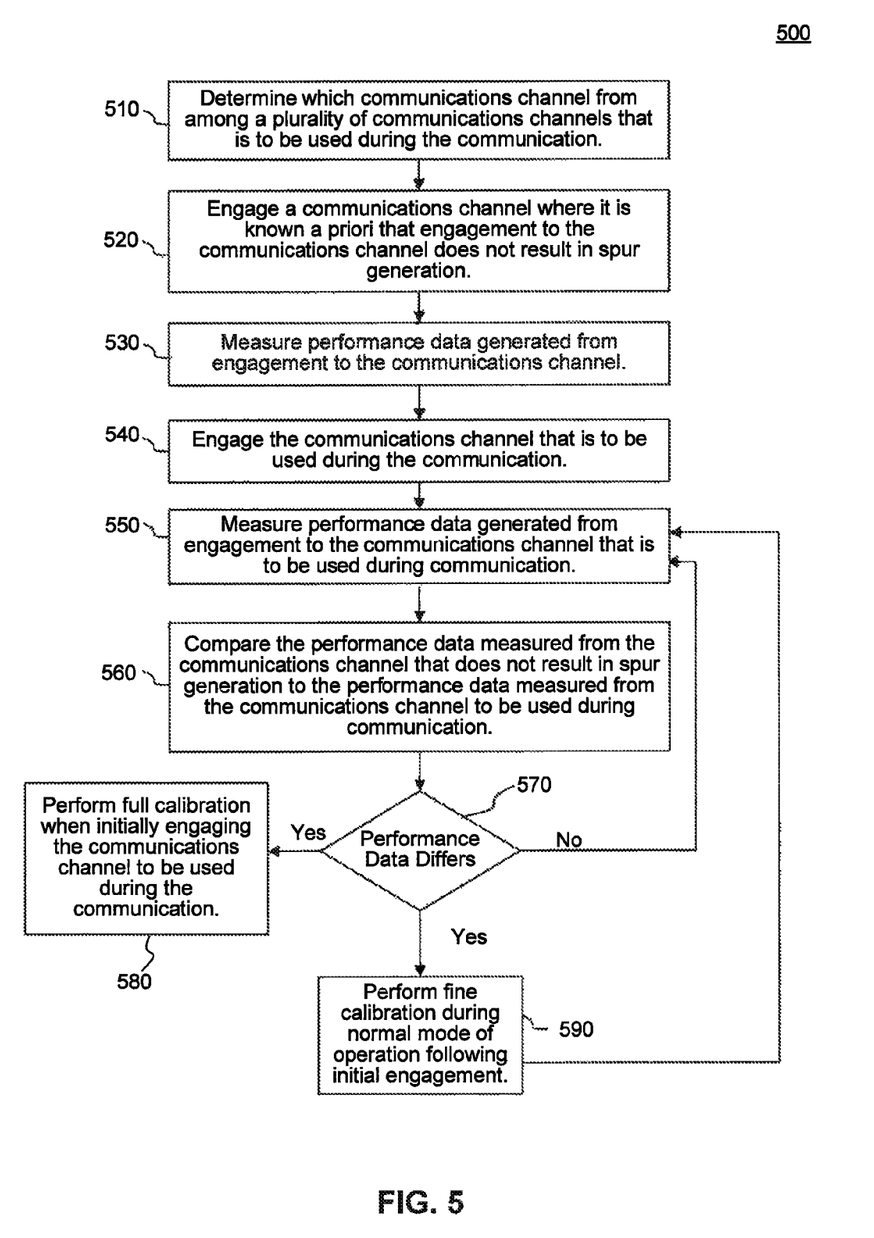
FIG. 5 is a flowchart of exemplary operational steps of the communications device according to an exemplary embodiment of the present disclosure.

FIG. 5 is a flowchart of exemplary operational steps of the communications device according to an exemplary embodiment of the present disclosure. The present disclosure is not limited to this operational description. Rather, it will be apparent to persons skilled in the relevant art(s) from the teachings herein that other operational control flows are within the scope and spirit of the present disclosure. The following discussion describes the steps in FIG. 5.

At step 510, the operational control flow determines a communications channel from among a plurality of communications channels that is to be used by a communications device to transmit and/or receive a communications signal.

At step 520, the operational control flow engages a communications channel where it is known a priori that engagement to the communications channel does not result in spur generation. Specifically, the operational control flow engages a communications channel where it is known a priori that spurs may not be generated onto a target signal, such as target signal 360 to provide an example.

At step 530, the operational control flow measures performance data generated from the engagement to the communications channel. Specifically, a controller module, such as the controller module 302 to provide an example, measures performance data, such as initial performance data 352, generated from the engagement to the communications channel.

At step 540, the operational control flow engages that communications channel that is to be used for the communication.

At step 550, the operational control flow measures the performance generated from the engagement to the communications channel that is to be used during communication. Specifically, the controller module, such as the controller module 302 to provide an example, measures performance data, such as actual performance data 354, generated from the engagement to the communications channel.

At step 560, the operational control flow compares the performance data measured from the communications channel that does not result in spur generation to the performance data measured from the communications channel to be used during communication. Specifically, the controller module, such as the controller module 302 to provide an example, measures performance data, such as initial performance data 352 to provide an example, measured from the communications channel that does not result in spur generation to the performance data, such as actual performance data 354 to provide an example, measured from the communications channel to be used during communication.

At step 570, the operational control flow determines whether to engage in full calibration or fine calibration or continue to measure the performance data generated from engagement to the communications channel that is to be used during communication. In determining whether to engage in full calibration or fine calibration, the operational control flow determines whether the communications channel to be used during communication may have been previously engaged. If the communications channel to be used during communication has not been previously engaged, then the operational control flow proceeds with engaging full calibration. If the communications channel to be used during communication has been previously engaged, the operational control flow proceeds with engaging in fine calibration. For example, the operation control flow determines whether the initial performance data 352 differs from the actual performance data 354. If the initial performance data 352 does not differ from the actual performance data 354, then no further calibration is required and the communications device continues to measure the performance data in step 550. As another example, the initial performance data 352 does differ from the actual performance data 354. Then operational control flow then proceeds to perform calibration.

At step 580, the operational control flow performs full calibration when initially engaging the communications channel to be used during the communication. Specifically, the operational control flow adjusts a reference oscillator, such as the reference oscillator 202 to provide an example, within the communications device to lock onto a target signal, such as target signal 360 to provide an example, then reverts to step 550.

At step 590, the operational control flow performs fine calibration during normal mode of operation following the initial engagement to the communications channel to be used during the communication. Specifically, the operational control flow adjusts the reference oscillator, such as the reference oscillator 202 to provide an example, within the communications device to lock onto the target signal, such as target signal 360 to provide an example, then reverts to step 550.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present disclosure. Thus the present disclosure should not be limited by any of the above-described exemplary embodiments, but should be defined only in accordance with the following claims and their equivalents.

What is claimed is:

1. A communications device, comprising:
   a reference oscillator configured to provide a reference signal that is operating at a reference frequency;
   a reference phase-locked loop (PLL) configured to provide a target signal that is operating at a target frequency; and
   a controller module configured to:
   calibrate the reference PLL such that the target signal tracks the reference signal when the communications device is engaged in a communications channel to eliminate a spur in the target signal when the reference frequency is different from the target frequency, and
   calibrate the reference oscillator by adjusting, based on a searching algorithm, the reference frequency until the reference frequency is proportional to the target frequency.

2. The communications device of claim 1, wherein the controller module is further configured to calibrate the reference oscillator by adjusting the reference frequency based on initial performance data measured when the communications device is engaged in an initial communications channel and performance data measured when the communications device is engaged in the communications channel.

3. The communications device of claim 2, wherein the controller module is further configured to compare the initial performance data with the performance data.

4. A method for eliminating a spur in a target signal provided by a phase-locked loop (PLL), the method comprising:
   engaging, by a communications device, a first communications channel, wherein the spur is not present in the target signal when the communications device is engaged in the first communications channel;
   measuring first communications channel performance data that is generated when the communications device is engaged in the first communications channel;
   transitioning, by the communications device, from the first communications channel to a second communications channel;
   measuring second communications channel performance data that is generated when the communications device is engaged in the second communications channel;
   comparing the first communications channel performance data with the second communications channel performance data; and
   if the first communications channel performance data differs from the second communications channel performance data adjusting, based on a searching algorithm, a reference frequency generated by a reference oscillator until the reference frequency is proportional to a target frequency.

5. The method of claim 4, further comprising:
calibrating the PLL such that the target signal tracks the reference signal generated by the reference oscillator when the communications device is engaged in the first communications channel.

6. The method of claim 4, wherein the spur is not generated in the target signal when the communications device is engaged in the first communications channel.

7. The method of claim 4, further comprising:
comparing a magnitude of a difference between the first communications channel performance data and the second communications channel performance data with a locking threshold.

8. The method of claim 7, further comprising:
determining that the reference frequency is proportional to the target frequency of the target signal if the magnitude of the difference between the first communications channel performance data and the second communications channel performance data is less than or equal to the locking threshold.

9. A communications device, comprising:
a reference oscillator configured to provide a reference signal at a reference frequency;
a reference phase-locked loop (PLL) configured to provide a target signal at a target frequency; and
a controller module configured to:
measure first performance data when the communications device is engaged in a communications channel,
measure second performance data when the communications device is engaged in a second communications channel,
compare the first performance data with the second performance data, and
in response to determining that the first performance data differs from the second performance data, adjust, based on a searching algorithm, a control signal until the reference frequency is proportional to the target frequency.

10. The communications device of claim 9, wherein the controller module is configured to eliminate a spur in the target signal when the communications device is engaged in the second communications channel in response to adjusting the control signal.

11. The communications device of claim 9, wherein the controller module is further configured to:
cycle through different combinations of the control signal using the searching algorithm until the reference frequency is proportional to the target frequency.

12. The communications device of claim 9, wherein the controller module is further configured to:
compare a magnitude of the difference between the first performance data and the second performance data with a locking threshold, and
determine that the reference frequency is proportional to the target frequency if the magnitude of the difference between the first performance data and the second performance data is less than or equal to the locking threshold.

13. The communications device of claim 12, wherein the reference PLL is configured to:
operate under a locked condition when the magnitude of the difference between the first performance data and the second performance data is less than or equal to the locking threshold.

14. The communications device of claim 12, wherein the reference PLL is configured to:
operate under an unlocked condition when the magnitude of the difference between the first performance data and the second performance data is greater than the locking threshold.

15. The communications device of claim 9, wherein the controller module is further configured to:
engage in full calibration if the second communications channel has been previously engaged by the communications device; and
engage in fine calibration if the second communications channel has not been previously engaged by the communications device.

16. The communications device of claim 9, wherein the communications device is configured to:
engage in the communications channel during an initial power up of the communications device.

17. The communications device of claim 9, wherein a spur is not generated in the target signal when the communications device is engaged in the communications channel.

18. The communications device of claim 9, further comprising:
a dithering module, wherein the controller module is further configured to:
adjust the control signal such that the dithering module adjusts a division code to compensate for a difference between the first performance data and the second performance data.

19. The communications device of claim 18, further comprising:
a frequency divider, wherein the frequency divider is configured to adjust a feedback signal based on the division code to compensate for the difference between the first performance data and the second performance data.

20. The communications device of claim 1, wherein the controller module is further configured to:
measure first performance data when the communications device is engaged in the communications channel;
measure second performance data when the communications device is engaged in a second communications channel; and
in response to determining that the first performance data differs from the second performance data, calibrate the reference oscillator.

* * * * *

UNITED STATES PATENT AND TRADEMARK OFFICE
CERTIFICATE OF CORRECTION

| | | |
|---|---|---|
| PATENT NO. | : 8,755,479 B2 | Page 1 of 1 |
| APPLICATION NO. | : 13/450134 | |
| DATED | : June 17, 2014 | |
| INVENTOR(S) | : Vavelidis et al. | |

It is certified that error appears in the above-identified patent and that said Letters Patent is hereby corrected as shown below:

In the Claims

Column 14, lines 64-65, please replace "performance data adjusting," with --performance data, adjusting,--.

Signed and Sealed this
Seventh Day of October, 2014

Michelle K. Lee
*Deputy Director of the United States Patent and Trademark Office*